(12) United States Patent
Chien et al.

(10) Patent No.: US 10,964,384 B2
(45) Date of Patent: Mar. 30, 2021

(54) METHOD FOR CONTROLLING RESISTIVE RANDOM-ACCESS MEMORY

(71) Applicant: Industrial Technology Research Institute, Hsinchu (TW)

(72) Inventors: Tsai-Kan Chien, Yunlin County (TW); Lih-Yih Chiou, Tainan (TW); Jing-Cian Lin, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 162 days.

(21) Appl. No.: 16/109,802

(22) Filed: Aug. 23, 2018

(65) Prior Publication Data

US 2018/0366187 A1 Dec. 20, 2018

Related U.S. Application Data

(62) Division of application No. 14/805,482, filed on Jul. 22, 2015, now abandoned.

(30) Foreign Application Priority Data

Jan. 14, 2015 (TW) .................................. 104101202

(51) Int. Cl.
*G11C 13/00* (2006.01)
*G06F 11/10* (2006.01)
*G06F 11/07* (2006.01)
*G11C 7/04* (2006.01)
*G11C 7/10* (2006.01)

(52) U.S. Cl.
CPC .......... *G11C 13/004* (2013.01); *G06F 11/073* (2013.01); *G06F 11/076* (2013.01); *G06F 11/1076* (2013.01); *G11C 7/04* (2013.01); *G11C 7/1006* (2013.01); *G11C 13/0033* (2013.01); *G11C 13/0064* (2013.01); *G11C 13/0069* (2013.01); *G11C 2013/0054* (2013.01)

(58) Field of Classification Search
None
See application file for complete search history.

(56) References Cited

U.S. PATENT DOCUMENTS 7,352,299 B1 4/2008 Liu
2006/0290542 A1 12/2006 Liu
(Continued)

FOREIGN PATENT DOCUMENTS

CN 101740134 6/2010
CN 102969028 3/2013

OTHER PUBLICATIONS

"Office Action of Taiwan Counterpart Application", dated Mar. 10, 2020, p. 1-p. 5.

(Continued)

*Primary Examiner* — Justin R Knapp
(74) *Attorney, Agent, or Firm* — JCIPRNET

(57) ABSTRACT

A method for controlling a resistive random access memory (ReRAM) is proposed. The method calculates a number of a bit value of a data when the data is to be written to the resistive random access memory. Each bit of the data is flipped and the data is written to the ReRAM if the number of the bit value is greater than a half of a length of the data. The data as it original is written to the ReRAM if the number of the bit value is less than a half of the length of the data.

15 Claims, 9 Drawing Sheets

(56) References Cited

U.S. PATENT DOCUMENTS

| | | |
|---|---|---|
| 2009/0091968 A1 | 4/2009 | Dietrich et al. |
| 2011/0080775 A1 | 4/2011 | Bae et al. |
| 2013/0003438 A1* | 1/2013 | Merkel .............. G11C 13/0061 |
| | | 365/148 |
| 2013/0155760 A1 | 6/2013 | Houssameddine |
| 2014/0010026 A1 | 1/2014 | Kim et al. |

OTHER PUBLICATIONS

"Office Action of China Counterpart Application", dated Aug. 7, 2019, p. 1-p. 9.
"Office Action of U.S. Appl. No. 14805482", dated Jan. 14, 2019, p. 1-p. 14, in which the listed reference was cited.

* cited by examiner

METHOD FOR CONTROLLING RESISTIVE RANDOM-ACCESS MEMORY

CROSS-REFERENCE TO RELATED APPLICATION

This application is a divisional application of and claims the priority benefit of U.S. application Ser. No. 14/805,482, filed on Jul. 22, 2015, now pending, which claims the priority benefit of Taiwan application serial no. 104101202, filed on Jan. 14, 2015. The entirety of each of the above-mentioned patent applications is hereby incorporated by reference herein and made a part of this specification.

TECHNICAL FIELD

The disclosure relates to a resistive random-access memory (RRAM or ReRAM), and particularly relates to a method for controlling a ReRAM.data retention error.

BACKGROUND

Resistive random access memory is a non-volatile memory. Compared with flash memory, using resistive random access memory in an embedded system allows the system to have a higher execution speed and lower power consumption. Thus, there is a chance that resistive random access memory will be the storage device of the next generation in replacement of flash memory. However, the device and circuit design of the resistive random access memory nowadays are still under development, and there are still issues concerning the reliability thereof. One of the issues is a write error that occurs due to state-changing failure of a resistive memory device being written, and another is a data retention error that occurs due to resistance drifting under high temperature.

The write error refers to an inconsistency between a value stored in the resistive memory device after data are written to the resistive random access memory and a value being written. The inconsistency results from variation in a manufacturing process, which makes devices in the same memory require different transition voltage and transition energy. Usually, the same transition voltage and transition time are adopted for the same resistive random access memory when data are written. Thus, a memory device requiring a higher transition voltage or a longer transition time may cause failing to change a state as the voltage or time is insufficient, thus making the value stored in the memory and the value being written inconsistent with each other.

The data retention error is that, after a period of time, a value read from the resistive random access memory is different from the value stored in the resistive random access memory. The inconsistency is due to unstable resistances of devices. The resistance of the resistive random access memory may drift under high temperature, making the resistance different from the resistance when the data is written. Thus, the data read from the memory is different from the data written to the memory.

SUMMARY

Another method for controlling a resistive random access memory of the disclosure includes steps as follows. When a data is to be written to the resistive random access memory, the number of a bit value of the data is calculated. If the number of the bit value is greater than a half of a length of the data, each bit of the data is flipped and the data is written to the resistive random access memory. If the number of the bit value is less than a half of a length of the data, the data is written as it original is to the resistive random access memory.

Another method for controlling a resistive random access memory of the disclosure includes steps as follows. A data is written to the resistive random access memory by using a write voltage. The number of errors is detected when the data is written. If the number of errors exceeds a threshold, the write voltage is increased and the preceding steps are repeated.

Another method for controlling a resistive random access memory of the disclosure includes steps as follows. A data is coded by using a first error correcting code, and the data is written to the resistive random access memory. The number of errors is detected when the data is written. If the number of errors exceeds a threshold corresponding to the first error correcting code, the first error correcting code is replaced with a second error correcting code and the preceding steps are repeated. The number of errors that the second error correcting code is able to correct is greater than the number of errors that the first error correcting code is able to correct.

Another method for controlling a resistive random access memory of the disclosure includes steps as follows. A data is written to the resistive random access memory by using a first write voltage set. The number of errors is detected when the data is written. If the number of errors is greater than a threshold, the data is stored in a waiting register. If the waiting register is already full of data, all the data stored in the waiting register are written to the resistive random access memory by using a second write voltage set. The second write voltage set is higher than the first write voltage set.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

The disclosure provides a resistive random access memory and a method for controlling the same, whereby a reliability of the memory is improved. The resistive random access memory and the method for controlling the same are capable of reducing write errors and data retention errors under high temperature, so as to enhance the reliability of a memory system and reduce a bit error rate.

One of exemplary embodiments discloses a mechanism related to write errors of the ReRAM and data retention errors under high temperature. The exemplary embodiment also provides a solution to a system through reducing a bit error rate of the memory to improve system reliability. A temperature sensor is adapted for resistance drifting under high temperature, so as to improve the reliability by adopting the solution to the system. Moreover, a Write-and-Verify error detecting result may be considered at the system end as a choice of error correcting codes, so as to take error correcting capability into account while a memory operating speed is increased at the same time. The disclosed mechanism may also be extensively applied to other memories, such as spin-transfer torque magnetoresistive random-access memory (STT-MRAM), ferroelectric random-access memory (FeRAM), phase-change random-access memory (PCRAM), and conductive-bridge random-access memory (CBRAM), etc. In practice, the mechanism may be realized in an embedded-type, an independent-type, or an array-type memory, etc.

An embodiment of the disclosure provides a method for controlling a resistive random access memory. The method includes two operation modes, namely a normal mode and a high temperature mode. The normal mode is suitable for an operation of the memory under room temperature, and the high temperature mode is suitable for an operation of the memory under a high temperature. According to the method, different reference resistances are set for a sense amplifier of a resistive random access memory in the two modes, and corresponding asymmetrical coding processes are respectively performed in the two modes.

Figure 1:
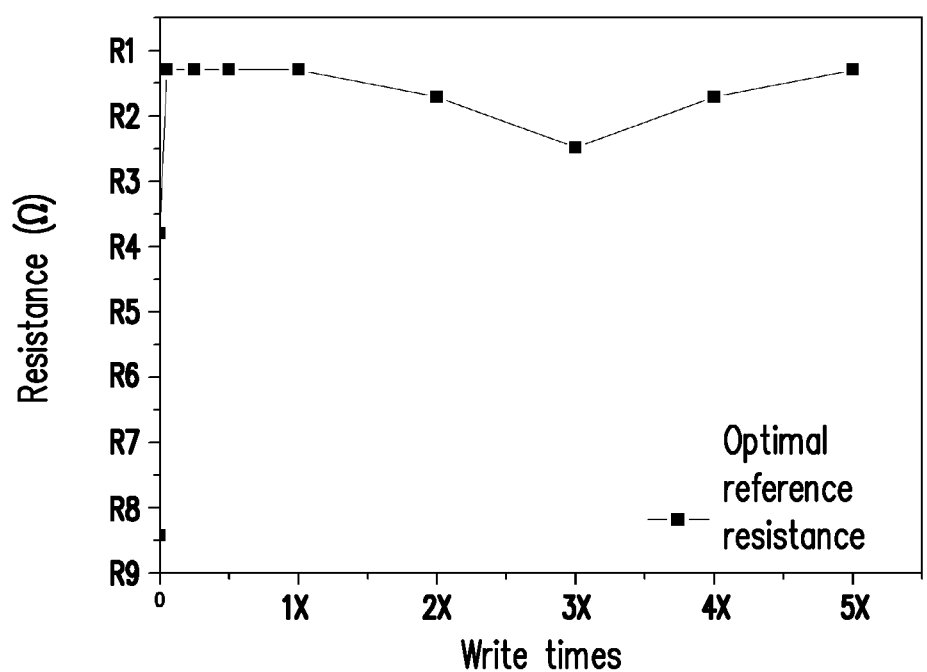
FIG. 1 is a schematic view illustrating an optimal reference resistance of a sense amplifier and the number of write times of a resistive random access memory according to an embodiment of the disclosure.

Under room temperature corresponding to the normal mode, resistance drifting of a resistive memory device is not significant, and write error is the main type of errors. Thus, the operation in the normal mode is directed to write errors. The reference resistance of the sense amplifier of the resistive random access memory serves to distinguish whether a resistance of the resistive memory device is a resistance in a high resistance state (HRS) or a resistance in a low resistance state (LRS). FIG. 1 is a schematic view illustrating an optimal reference resistance of a sense amplifier and the number of write times of a resistive random access memory according to an embodiment of the disclosure. FIG. 1 illustrates the optimal reference resistances of the sense amplifier with respect to different numbers of write times. Resistances R1 to R9 and the number of write times X shown in FIG. 1 are determined by a manufacturing process of the resistive random access memory. The optimal reference resistance is figured out according to resistance distributions of HRS and LRS with different numbers of write times. The experimental results of FIG. 1 show that the optimal reference resistances of the sense amplifier with respect to different numbers of write times are close to R1. Thus, the reference resistance of the sense amplifier in the normal mode may be set at R1 to obtain an optimal yield rate.

The write errors of the resistive random access memory also exhibit an asymmetrical characteristic. When the operation is performed under room temperature, a chance of error in an operation of writing a high resistance (also called reset operation or "reset" where a bit value "1" is written) is higher than a chance of error in an operation of writing a low resistance (also called set operation or "set" where a bit value "0" is written). The pattern is opposite in an operation under a high temperature. A chance of error in writing a low resistance is higher than a chance of error in writing a high resistance. Thus, asymmetrical coding is required for the asymmetrical characteristic of the write errors.

Figure 2A:
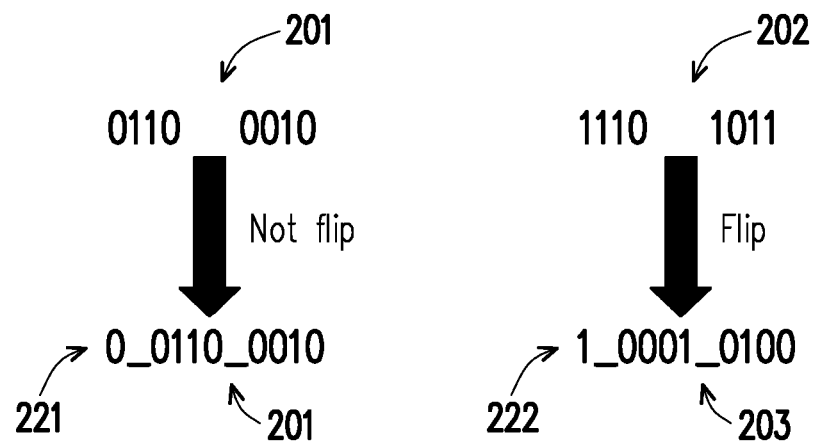
FIG. 2A is a schematic view illustrating an asymmetrical coding according to an embodiment of the disclosure.

The asymmetrical coding for the normal mode is described in the following. FIG. 2A is a schematic view illustrating asymmetrical coding for the normal mode according to an embodiment of the disclosure. When a data is to be written to the resistive random access memory, the number of the bit value "1" in the data is calculated. If the number of the bit value "1" is less than a half of a length of the data, the data is written as it original is to the resistive random access memory. The length of the data is also the bit number of the data. For example, a data 201 in FIG. 2A is a data with 8 bits, and a half of the length of the data 201 is 4. Since the number of the bit value "1" in the data 201 is 3, less than a half of the length of the data 201, the data 201 may be written as it original is to the resistive random access memory. A flag bit 221 is a flag bit corresponding to the data 201 in this embodiment. A value of the flag bit 221 being 0 indicates that there is no flipping when the data 201 is written to the resistive random access memory. Therefore, the data 201 does not require flipping when being read from the resistive random access memory.

When a data is to be written to the resistive random access memory, if the number of bit values "1" in the data is greater than a half of a length of the data, each bit of the data is flipped. In other words, all the bit values "1" are flipped to the bit values "0", and all the bit values "0" are flipped into the bit values "1". Then, the data is written to the resistive random access memory. Taking a data 202 in FIG. 2A as an example, the number of the bit value "1" is 6, exceeding a half of a length of the data 202. Thus, the data 202 is flipped into a data 203, and then the data 203 is written to the resistive random access memory. Since the data 202 is flipped before being written to the resistive random access memory, a corresponding flag bit 222 is set at 1, indicating that the data 203 can be flipped to be restored to the data 202 when being read from the resistive random access memory. The flag bits 221 and 222 may be stored in the same resistive random access memory or stored in another memories.

The asymmetrical coding shown in FIG. 2A may reduce the number of HRS (bit value "1") in the data and increases the number of LRS (bit value "0"), so as to reduce the chance of write errors of the data.

In the following, the high temperature mode in the method for controlling the resistive random access memory is described in detail. The high temperature mode is adapted to reduce data maintenance errors due to resistance drifting under high temperature. According to the experiment, the LRS drifts toward a high resistance value, while the HRS drifts to a resistance boundary R2 at the lowest. In other words, however drastic the resistance drifting may be, under high temperature, a resistive memory device in the resistive random access memory having a resistance greater than R2 is eventually greater than R2. The bit value read from the HRS devices is still "1" with no influence of resistance drifting.

In this embodiment, the reference resistance of the sense amplifier in the normal mode is R1, and the reference resistance in the high temperature mode is R2. In another embodiment, the experimental results of FIG. 1 may be varied. Thus, the reference resistances in the normal mode and the high temperature mode may be other values.

Asymmetrical coding in the high temperature mode is opposite to the asymmetrical coding in the normal mode, because, through adjustment of the reference resistance of the sense amplifier, a data retention error is more likely to occur in a resistive memory device in the low resistance state under a high temperature. Thus, asymmetrical coding in the high temperature mode is adapted to reduce the number of the bit value "0", so as to reduce the chance of data errors occurred.

Figure 2B:
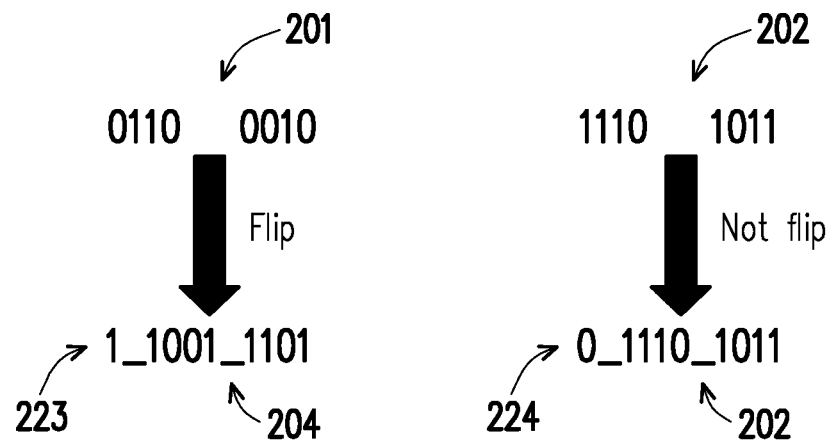
FIG. 2B is a schematic view illustrating an asymmetrical coding according to another embodiment of the invention.

FIG. 2B is a schematic view illustrating asymmetrical coding for the high temperature mode according to an embodiment of the disclosure. When a data is to be written to the resistive random access memory, if the number of bit value "0" in the data is greater than a half of a length of the data, each bit of the data is flipped, and then the data is written to the resistive random access memory. Taking a data 201 in FIG. 2B as an example, the number of the bit value "0" is 5, exceeding a half of the length of the data 201. Thus, the data 201 is flipped into a data 204, and then the data 204 is written to the resistive random access memory. Since the data 201 is flipped before being written to the resistive random access memory, a corresponding flag bit 223 is set at 1, indicating that the data 204 can be flipped to be restored to the data 201 when being read from the resistive random access memory.

When a data is to be written to the resistive random access memory, if the number of the bit value "0" in the data is less than a half of a length of the data, the data is written as it original is to the resistive random access memory. For example, the number of the bit value "0" in the data 202 in FIG. 2B is 2, less than a half of the length of the data 202. Thus, the data 202 may be written as it original is to the resistive random access memory. A flag bit 224 is a flag bit corresponding to the data 202 in this embodiment. A value of the flag bit 224 being 0 indicates that the data 202 is not flipped when being written to the resistive random access memory, so the data 202 does not need to be flipped when being read from the resistive random access memory. The flag bits 223 and 224 may be stored in the same resistive random access memory or stored in another memories.

Figure 3:
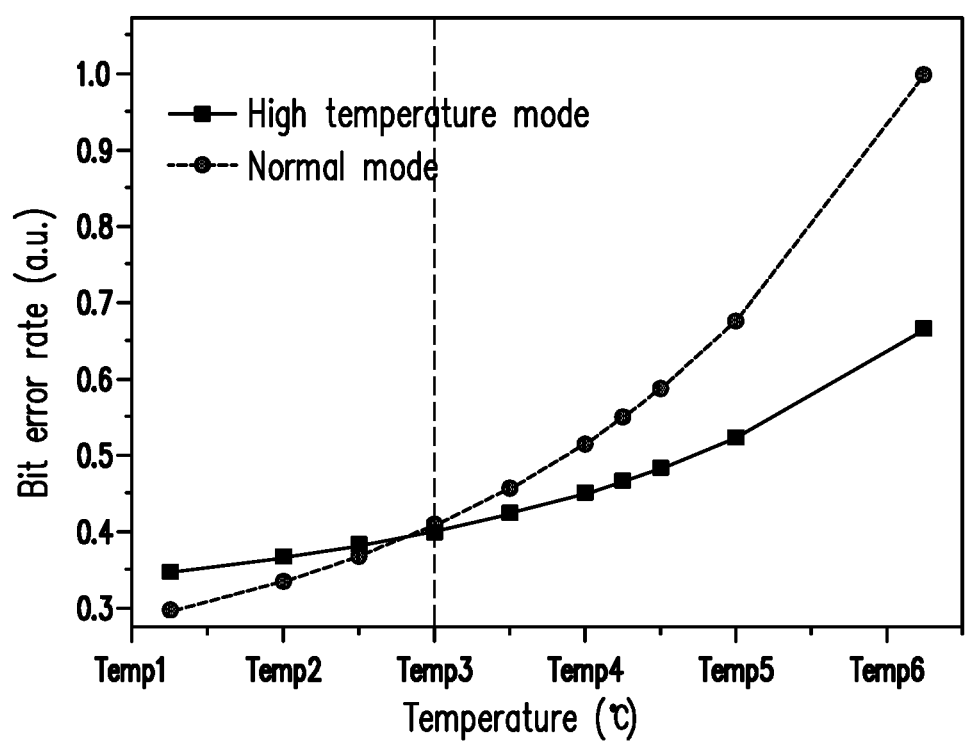
FIG. 3 is a schematic view illustrating a bit error rate of a resistive random access memory in different operation modes under an influence of temperature according to an embodiment of the disclosure.

In the following, setting of a switching temperature that distinguishes the normal mode and the high temperature mode is described. FIG. 3 is a diagram illustrating a relation between a bit error rate (BER) and the temperature when the resistive random access memory is placed under different temperatures for a long period of time and operated in different modes according to an embodiment of the disclosure. Temperatures Temp 1 to Temp 6 shown in FIG. 3 are determined by the manufacturing process of the resistive random access memory. As shown in FIG. 3, a bit error rate in the high temperature mode is higher than that in the normal mode under room temperature because, as mentioned above, the data drifting errors at a lower temperature are not significant. Thus, operating the device in the high temperature mode is not advantageous. Instead, the number of write errors increases due to changing of the reference resistance of the sense amplifier, making the bit error rate higher. Also, FIG. 3 shows that Temp3 is a crossing point of curves of the bit error rates of the normal mode and the high temperature mode. This is because the data retention errors due to resistance drifting become more significant than the write errors when the temperature is higher than Temp3. At this point, switching to the high temperature mode may reduce the bit error rate. Thus, the switching temperature of the normal mode and the high temperature mode of this embodiment may be set at Temp3. In another embodiment, the experimental results of FIG. 3 may change, so the switching temperature may be set at a different temperature.

Figure 4:
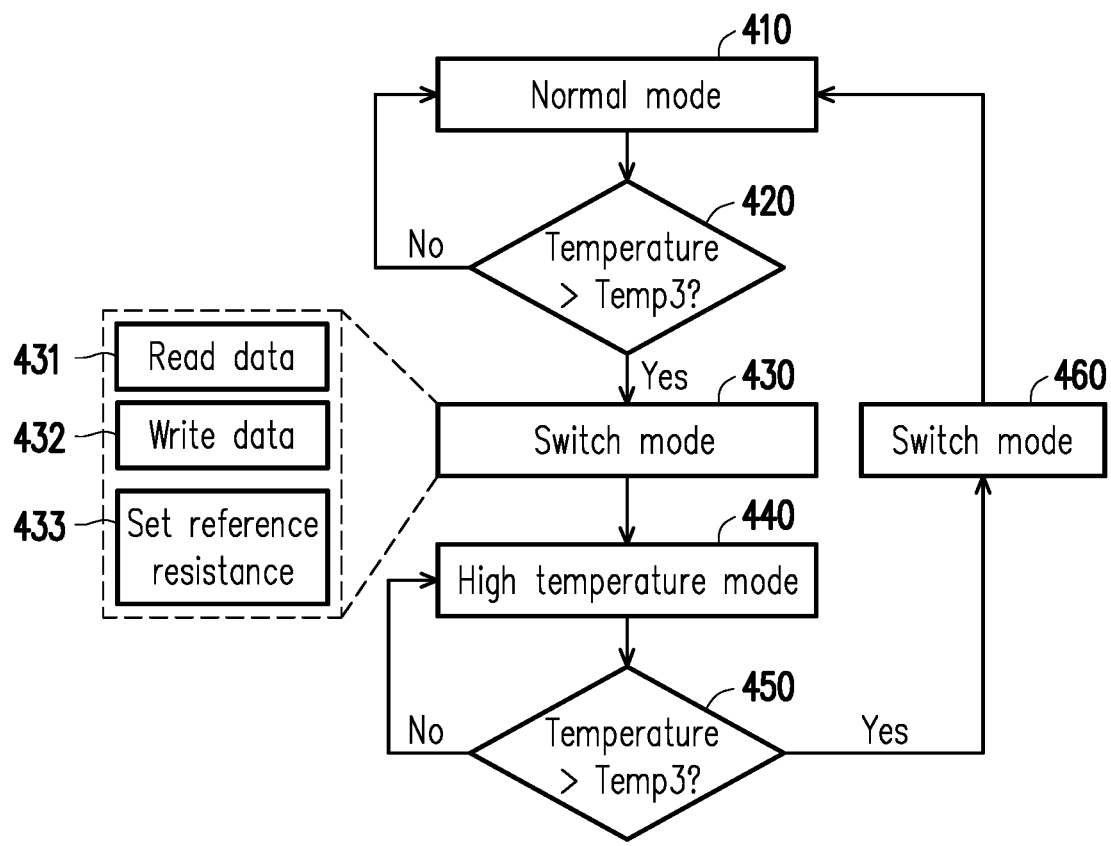
FIG. 4 is a flowchart illustrating a method for controlling a resistive random access memory according to an embodiment of the disclosure.

FIG. 4 is a flowchart illustrating mode switching of a method for controlling a resistive random access memory according to an embodiment of the disclosure. At Step 410, the resistive random access memory is operated according to the normal mode. In other words, the reference resistance of the sense amplifier and asymmetrical coding corresponding to the normal mode are used. At Step 420, the temperature of the resistive random access memory may be detected and whether the temperature of the resistive random access memory is higher than the switching temperature Temp3 may be checked. If the temperature of the resistive random access memory is not higher than the switching temperature, the flow returns to Step 410. If the temperature of the resistive random access memory is higher than the switching temperature, the memory is switched to the high temperature mode at Step 430.

When switching the mode, the data of the whole resistive random access memory can be refreshed. If the old data are not refreshed and are read after the memory is switched to the new mode, the data read and the data originally stored become inconsistent because the reference resistance of the sense amplifier used when the old data are stored and the reference resistance that the sense amplifier currently uses are different. Thus, Step 430 includes Steps 431 to 433. At Step 431, all the data of the resistive random access memory are read by using the reference resistance (R1) of the sense amplifier of the resistive random access memory in the normal mode. Then, at Step 432, all the data are written back to the resistive random access memory according to the high temperature mode. Subsequently, at Step 433, the reference resistance of the sense amplifier of the resistive random access memory is set at the reference resistance (R2) corresponding to the high temperature mode.

Then, at Step 440, the resistive random access memory is operated according to the high temperature mode. In other words, the reference resistance of the sense amplifier and the asymmetrical coding corresponding to the high temperature mode are used. At Step 450, the temperature of the resistive random access memory may be detected and whether the temperature of the resistive random access memory is lower than the switching temperature Temp3 may be checked. If the temperature of the resistive random access memory is not lower than the switching temperature, the flow returns to Step 440. If the temperature of the resistive random access memory is lower than the switching temperature, the memory is switched to the normal mode at Step 460, and the flow returns to Step 410.

Step 460 is similar to Step 430. In other words, all the data of the resistive random access memory are read according to the reference resistance (R2) of the sense amplifier of the resistive random access memory in the high temperature mode. Then, all the data are written back to the resistive random access memory according to the normal mode. Subsequently, the reference resistance of the sense amplifier of the resistive random access memory is set at the reference resistance (R1) corresponding to the normal mode.

In another embodiment of the disclosure, the mode may be switched after the temperature of the resistive random access memory becomes stable. For example, Step 420 may be modified, such that when a time duration that the temperature of the resistive random access memory is higher than the switching temperature Temp3 reaches a preset length of time, Step 430 is performed to switch to the high temperature mode. Step 450 may be modified, such that when a time duration that the temperature of the resistive random access memory is lower than the switching temperature Temp3 reaches a preset length of time, Step 460 is performed to switch to the normal mode. Such design prevents occurrence of errors or reduction of a memory read/write efficiency due to repetitive switching between modes.

Figure 5:
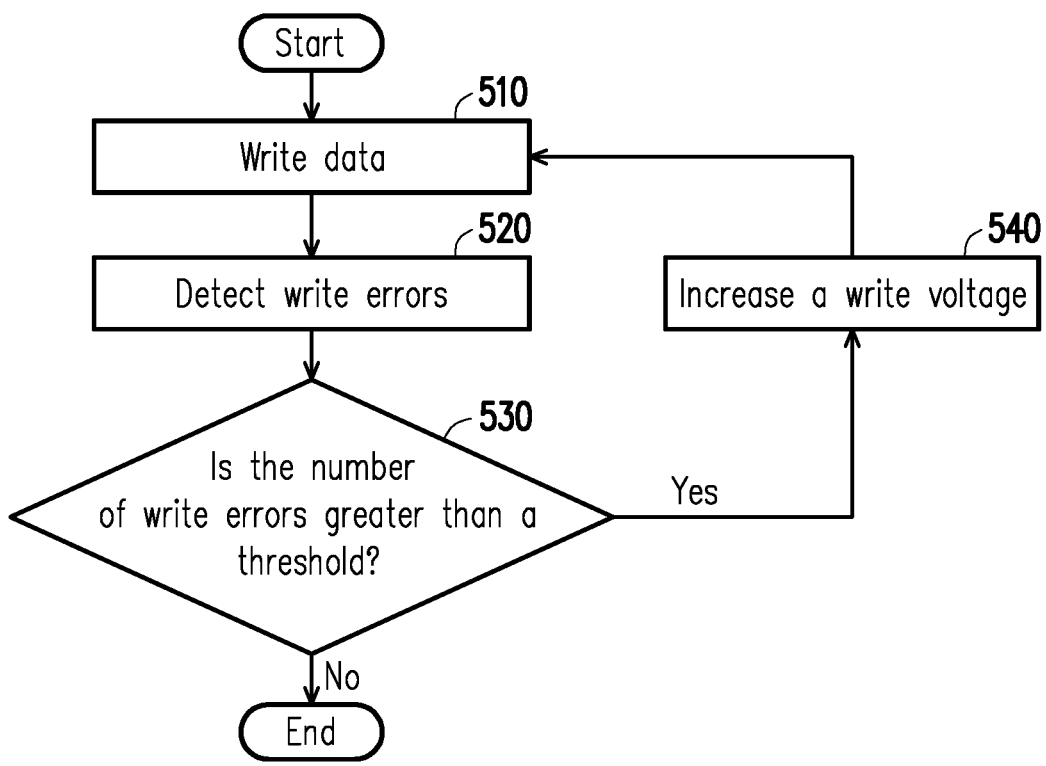
FIG. 5 is a flowchart illustrating a method for controlling a resistive random access memory according to another embodiment of the disclosure.

FIG. 5 is a flowchart illustrating data writing of a method for controlling a resistive random access memory according to an embodiment of the disclosure. The method shown in FIG. 5 adopts a set of sequentially increasing voltages for data writing. For the resistive random access memory, using a higher write voltage increases a chance that a resistive memory device changes a state. However, an overly high write voltage may overly change the state of the resistive memory device, making the state of the device unable to be further changed and remain at the bit value "0" or "1". The device is thus damaged. Thus, in this embodiment, the chance of successfully changing the state is increased by gradually increasing the write voltage.

In the following, the method of FIG. 5 is described in detail. At Step 510, a data is written to the resistive random access memory by using a preset write voltage. At Step 520, the number of write errors of the data is detected. In other words, the data previously written is read from the resistive memory device where the data is written to compare with original values that are written. Then, the number of bits whose values are inconsistent is calculated. Detection at Step 520 may be performed by an internal circuit of the resistive random access memory or a controller of the resistive random access memory.

At Step 530, whether the number of errors is greater than a threshold for error correction is checked. If the number of errors is not greater than the threshold, writing of the data is completed. If the number of errors is greater than the threshold, the write voltage is increased at Step 540 and the preceding steps are performed again.

If the data is directly written to the resistive random access memory without coding with an error correcting code, the threshold at Step 530 is equal to 0. If the data is coded with the error correcting code and then written to the resistive random access memory, the threshold at Step 530 is equal to the number of errors that the error correcting code is able to correct.

There are usually a preset number of write voltages. For example, in this embodiment, eight levels of write voltages are used. For the reset operation, the first level of the write voltage is −V1, the second level of the write voltage is −V2, the third level of the write voltage is −V3, and so on. Finally, the eighth level of the write voltage is −V8. The set operation is opposite. The first level of the write voltage is +V1, the second level of the write voltage is +V2, the third level of the write voltage is +V3, and so on. Finally, the eighth level of the write voltage is +V8. When writing a data, the write voltage gradually increases whether the reset operation or the set operation is performed. Since the write voltages of the two operations are in opposite directions, the write voltages of the two operations have different signs. If the number of write errors is still greater than the threshold after the last write voltage is used, data writing fails.

In another embodiment, the number and values of the write voltages may change with the design of the resistive random access memory.

Figure 6:
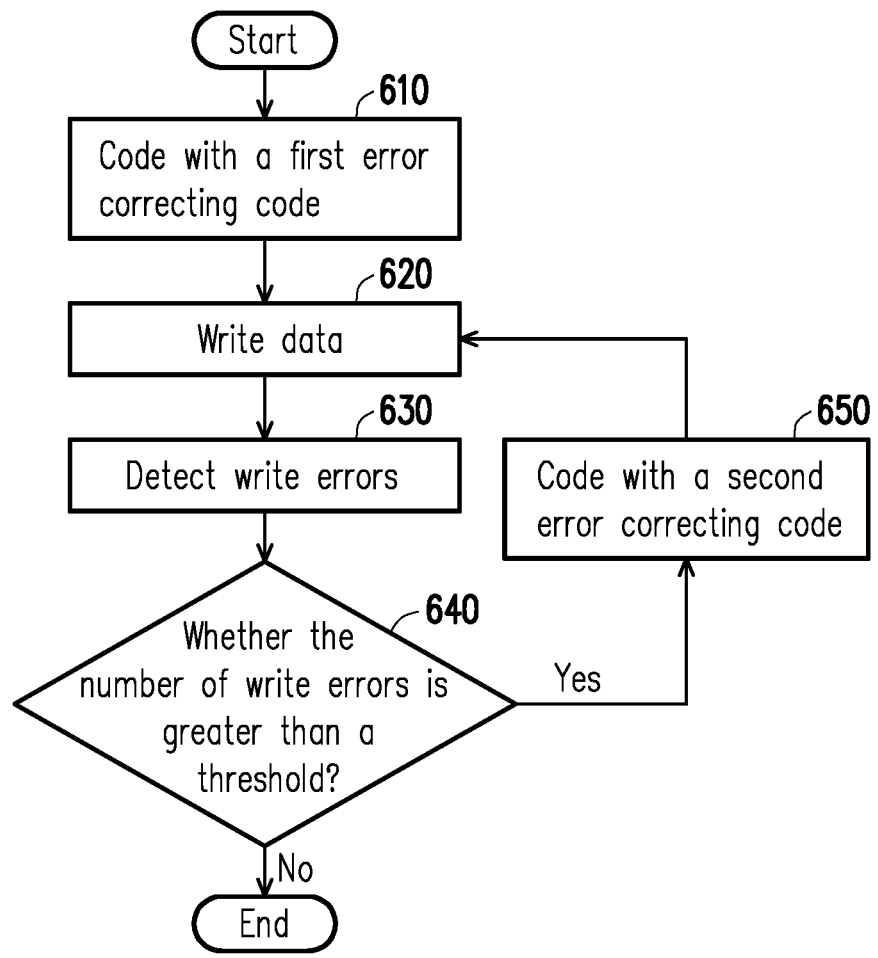
FIG. 6 is a flowchart illustrating a method for controlling a resistive random access memory according to another embodiment of the disclosure.

FIG. 6 is a flowchart illustrating data writing of a method for controlling a resistive random access memory according to another embodiment of the disclosure. In this embodiment, a plurality of error correcting codes is used for data writing. First, at Step 610, a data is coded by using a first error correcting code. Then, at Step 620, the data is written to the resistive random access memory. At Step 630, the number of errors when the data is written is detected. At Step 640, whether the number of errors is greater than the threshold corresponding to the error correcting code is checked. If the number of errors is not greater than the threshold, writing of the data is completed. Alternatively, if the number of errors is greater than the threshold, at Step 650, the data is coded by using a second error correcting code with a better correcting capability (i.e., able to correct more errors) and then the flow returns to Step 620. The threshold at Step 640 may be the number of errors that the current error correcting code is able to correct.

According to the flow shown in FIG. 6, when the number of errors in data writing exceeds the threshold, the error correcting code capable of correcting more errors may be used for data writing, until the number of errors is less than or equal to the threshold. The more number of errors that the error correcting code is able to correct, the longer time is required for coding and decoding. With the flow of FIG. 6, each data may be coded with a suitable error correcting code, thus ensuring an error correcting capability of the data and avoiding an overly long coding and decoding time.

For example, when a data is written for the first time, the first error correcting code may be a Hamming code. When the same data is written for the second time, the second error correcting code may be a BCH code. A specification of the Hamming code is (12, 8, 1). Namely, a length of an input data is 8 bits, a length of a coded data is 12 bits, and the code is able to correct an error no more than one bit. Coding and decoding with the Hamming code both require one clock cycle. As for the BCH code, a specification of the BCH code is (56, 32, 4). Namely, a length of an input data is 32 bits, a length of a coded data is 56 bits, and the code is able to correct an error no more than four bits. Coding with the BCH code requires 56 clock cycles, while decoding with the BCH code requires 159 clock cycles.

In another embodiment, the methods shown in FIGS. 5 and 6 may be combined to perform data writing. For example, N write voltages that gradually increase may be set in default. Here, N may be a positive integer greater than 1. When a data is to be written to the resistive random access memory, an error correcting code may be used and the N write voltages are used in sequence to write the data. If the number of errors is still greater than the threshold when the last write voltage is used, another error correcting code is able to correct more errors is used and the same N write voltages are used in sequence to write the data, and so on so forth. Such writing procedure may be represented by double loops. An inner loop corresponds to the method shown in FIG. 5, while an outer loop corresponds to the method shown in FIG. 6.

In the high temperature mode, the threshold at Step 640 may change as the data differs, instead of being fixed at the same value, because in the high temperature mode, the data retention errors caused by resistance drifting is the main reason why the errors occur. The threshold under room temperature takes the write errors caused by failure to change the state into consideration without considering the data retention errors caused by resistance drifting, making the chosen error correcting code unable to effectively solve the write errors and data retention errors at the same time.

In the high temperature mode, due to the resistance boundary of drifting from a high resistance to a low resistance and the adjustment of the reference resistance of the sense amplifier, the data retention errors are more likely to occur in a resistive memory device in the low resistance state. Thus, the chance of errors due to resistance drifting is positively proportional to the number of the bit value "0" in the data.

The errors detected at Step 630 are write errors caused by state-changing failure. Since the number of errors that the error correcting code is able to correct is fixed, if there are more write errors requiring correction, the data retention errors that are able to be corrected decrease. Thus, the number of write errors that the error correcting code is able to tolerate becomes fewer as the number of the bit value "0" in the data increases. In other words, as the number of the bit value "0" in the data increases, the error correcting code preserves a higher correcting capability for the data retention errors caused by resistance drifting.

Figure 7:
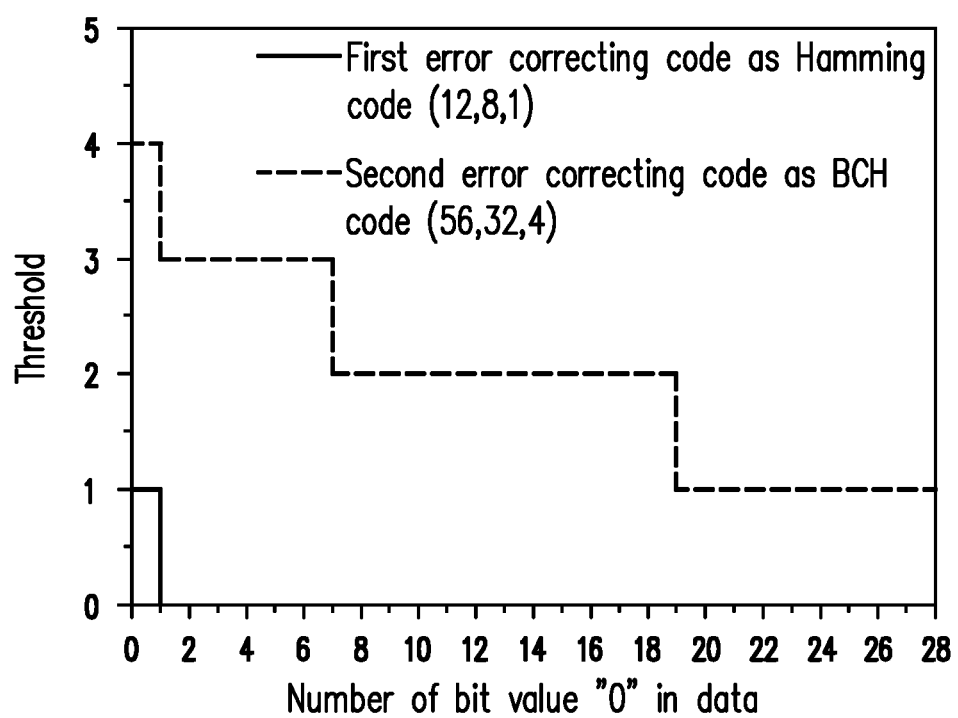
FIG. 7 is a schematic view illustrating a threshold of an error correcting code according to an embodiment of the disclosure.

Based on the reasons above, the threshold at Step 640 may be adjusted in the high temperature mode according to the number of the bit value "0" in the data, as shown in FIG. 7. FIG. 7 is a diagram illustrating a relation between the threshold corresponding to the error correcting codes (Hamming code and BCH code) and the number of the bit value "0" in the data to be written. As shown in FIG. 7, the threshold corresponding to the Hamming code is a decreasing function of the number of the bit value "0" in the data, and an upper limit of the threshold is also the number of errors that the Hemming code is able to correct, namely 1. The threshold corresponding to the BCH code is also a decreasing function of the number of the bit value "0" in the data, and an upper limit of the threshold is the number of errors that the BCH code is able to correct, namely 4. With such adjustment to the threshold, the write errors and the data retention errors are able to be considered at the same time.

Figure 8:
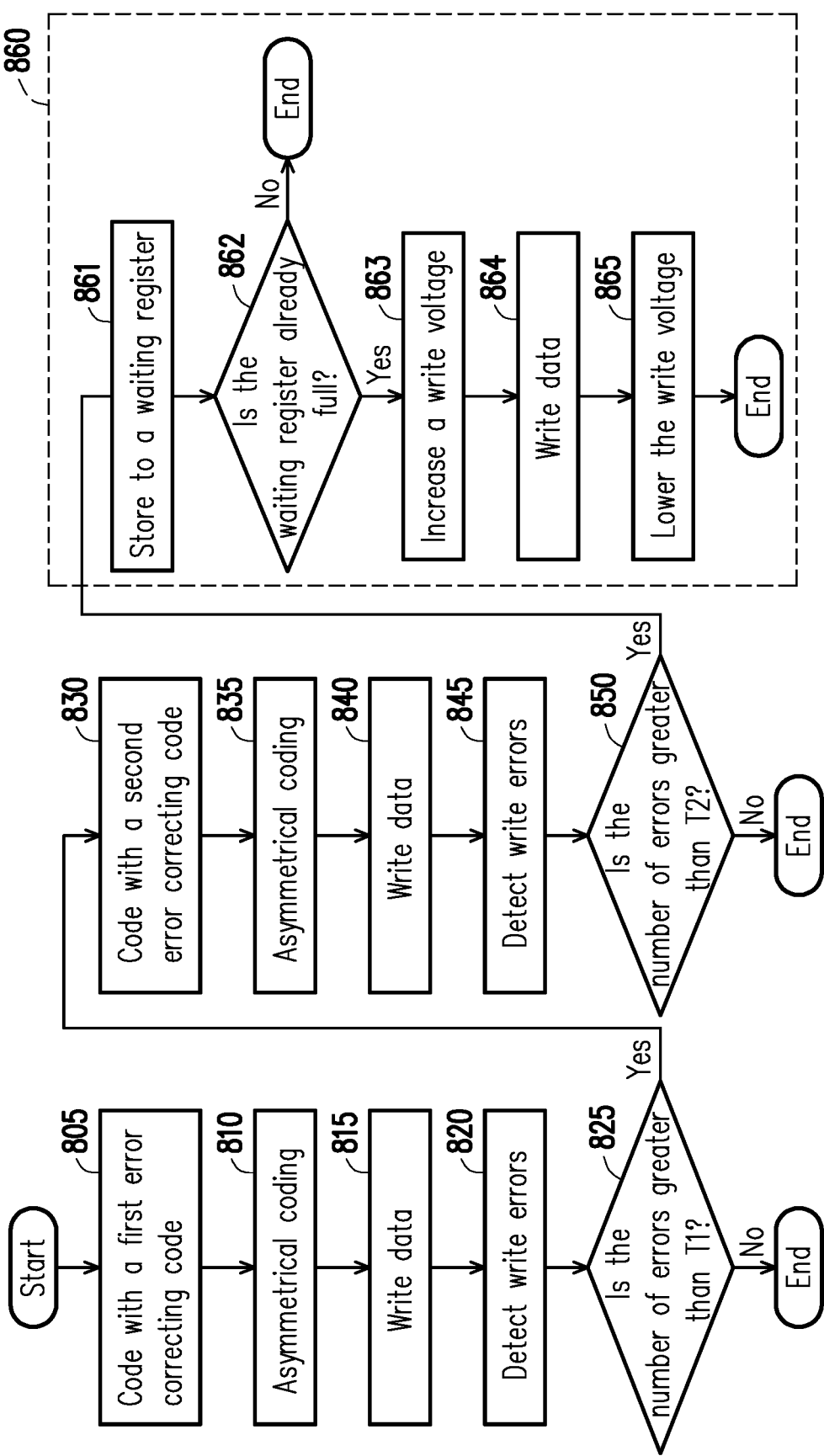
FIG. 8 is a flowchart illustrating a method for controlling a resistive random access memory according to an embodiment of the disclosure.

FIG. 8 is a flowchart illustrating data writing of a method for controlling a resistive random access memory according to an embodiment of the disclosure. When a data is to be written to the resistive random access memory, at Step 805, the first error correcting code is firstly used to code the data. At Step 810, the data is coded by using asymmetrical coding. At Step 815, the coded data is written to the resistive random access memory. At step 820, the number of errors when the data is written is detected. At Step 825, whether the number of errors is greater than a threshold T1 is checked. If the number of errors is not greater than the threshold T1, writing of the data is completed. If the number of errors is greater than the threshold T1, the flow goes to Step 830.

At Step 830, the second error correcting code is used to code the data. At Step 835, the data is coded by using asymmetrical coding. At Step 840, the coded data is written to the resistive random access memory. At step 845, the number of errors when the data is written is detected. At Step 850, whether the number of errors is greater than a threshold T2 is checked. If the number of errors is not greater than the threshold T2, writing of the data is completed. If the number of errors is greater than the threshold T2, the flow goes to Step 860.

In the normal mode, the number of the bit value "0" is increased in the asymmetrical coding processes at Steps 810 and 835 to reduce the chance that the write errors occur, as shown in FIG. 2A. In the high temperature mode, the number of the bit value "1" is increased in the asymmetrical processes at Steps 810 and 835 to reduce the errors caused by resistance drifting, as shown in FIG. 2B.

In the normal mode, the threshold T1 at Step 825 is the number of errors that the first error correcting code is able to correct. In the high temperature mode, the threshold T1 at Step 825 gradually decreases with the number of the bit value "0" in the data, as shown in FIG. 7. Following the same logic, in the normal mode, the threshold T2 at Step 850 is the number of errors that the second error correcting code is able to correct. In the high temperature mode, the threshold T2 of Step 850 gradually decreases with the number of the bit value "0" in the data, as shown in FIG. 7. The thresholds T1 and T2 in the normal mode are fixed and take the write errors into consideration. The thresholds T1 and T2 in the high temperature mode take the write errors and the data retention errors into consideration at the same time, so the thresholds T1 and T2 are adjusted according to the number of the bit value "0".

At Step 860, data that previously fail to write, i.e., data that fail to pass the checking processes in Steps 825 and 850, are collected, and then a higher write voltage is used to write the data to the resistive random access memory as a batch. In some embodiments, it may take a while to adjust the write voltage. The efficiency of the memory may be reduced if the write voltage can be adjusted for each data. Thus, it requires a temporary storing and batch writing mechanism of Step 860.

Step 860 includes Steps 861 to 865. At Step 861, the data failing to pass the checking process in Step 850 are stored into a waiting register. At Step 862, whether the waiting register is already full of data is checked. If the waiting register is not full of data, the data is temporarily stored, and the flow temporarily ends here. If the waiting register is already full of data, the write voltage is increased at Step 863, and all the data stored in the waiting register are written to the resistive random access memory at Step 864. The write voltage used at Step 864 is higher than the write voltages used in Steps 815 and 840. Then, at Step 865, the write voltage is lowered to the write voltages used in Steps 815 and 840. The writing of data is thus completed.

As shown in FIG. 8, the difference between Steps 805 to 825 and Steps 830 to 850 lies in the different error correcting codes used. Steps 805 to 825 correspond to the first error correcting code. Steps 830 to 850 correspond to the second error correcting code. In another embodiment, the types and number of error correcting codes may be adjusted. There may be one error correcting code used, or at least three error correcting codes may be used. The error correcting code used later has a higher error correcting capability.

In another embodiment, multiple levels of write voltages similar to the flow shown in FIG. 5 may be adopted in Steps 815, 840, and 864 to write data. An increasing sequence with M write voltages, including write voltages $V_{1,1}$, $V_{1,2}$ ... $V_{1,M}$, and another increasing sequence with N write voltages, including write voltages $V_{2,1}$, $V_{2,2}$ ... $V_{2,N}$, may be defined in advance. M and N are both integers greater than 1. M and N may be the same or different. The write voltage $V_{2,1}$ is greater than the write voltage $V_{1,M}$. At Steps 815 and 840, one of the write voltages $V_{1,1}$ to $V_{1,M}$ may be used in sequence to write the data. At Step 864, one of the write voltages $V_{2,1}$ to $V_{2,N}$ may be used in sequence to write the data.

Figure 9:
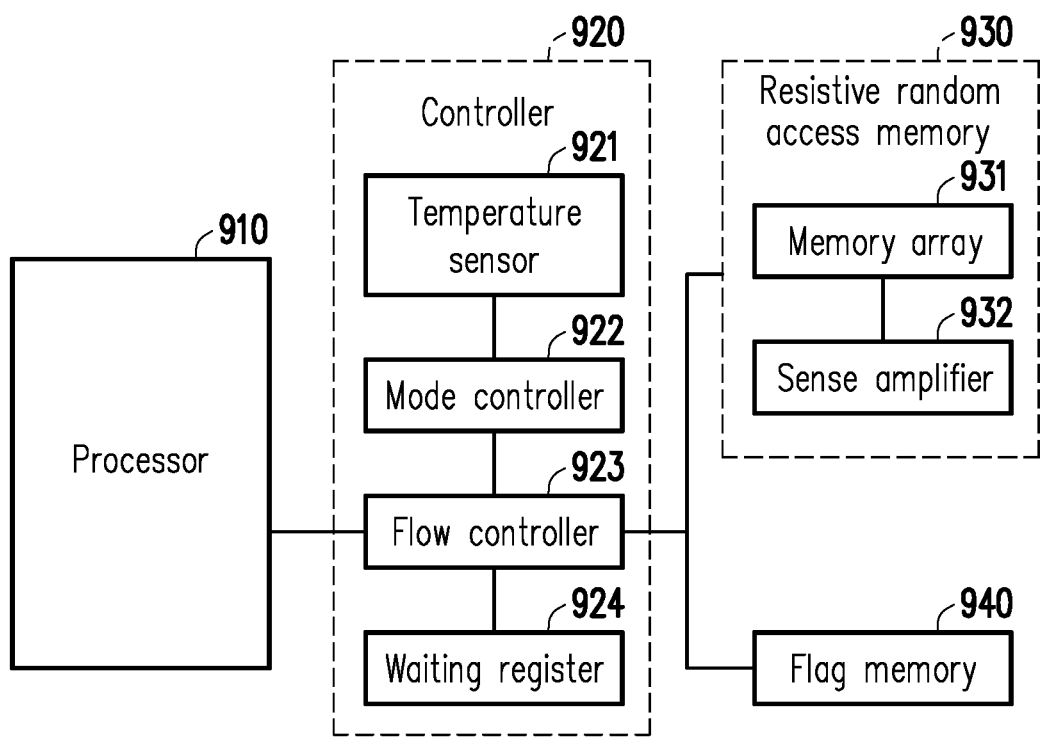
FIG. 9 is a schematic view illustrating a controller and a resistive random access memory according to an embodiment of the disclosure.

FIG. 9 is a schematic view illustrating a controller 920 and a resistive random access memory 930 according to an embodiment of the disclosure. The resistive random access memory 930 includes a resistive memory array 931 and a sense amplifier 932. The sense amplifier 932 is coupled to the resistive memory array 931. The resistive memory array 931 includes a plurality of resistive memory devices. The resistive memory devices may store data of different values by using different resistance states. The sense amplifier 932 may determine the resistance states of the resistive memory devices according to the reference resistance, so as to output the data stored in the resistive memory devices.

The controller 920 is a controller of the resistive random access memory 930. The controller 920 is coupled to a processor 910, the resistive random access memory 930, and a flag memory 940. The controller 920 includes a temperature sensor 921, a mode controller 920, a flow controller 923, and a waiting register 924 coupled in series. The temperature sensor 921 and the waiting register 924 are hardware components. The mode controller 922 and the flow controller 923 may be implemented as hardware components or software executed by the controller 920.

The temperature sensor 921 detects the temperature of the resistive random access memory 930. The controller 920, the resistive random access memory 930, and the flag memory 940 of this embodiment form a system on chip (SoC). Thus, the temperature sensor 921 is able to detect the temperature of the resistive random access memory 930. If the controller 920 and the resistive random access memory 930 are not in the same chip, the temperature sensor 921 may be a part of the resistive random access memory 930. For example, the temperature sensor 921 may be disposed beside or in the resistive memory array 931.

The controller 920 may read data from or write data to the resistive random access memory 930 according to a command sent by the processor 910. The waiting register 924 may be the waiting register in Step 860. The flag memory 940 may store the flag bits 221 to 224 in FIGS. 2A and 2B.

The mode controller 922 controls the operation mode of the resistive random access memory 930 and switches the reference resistance of the sense amplifier 932. In other words, the mode controller 922 may execute the method shown in FIG. 4. The flow controller 923 controls data accessing of the resistive random access memory 930 as well as coding and decoding of the error correcting code. In other words, the flow controller 923 may execute the methods shown in FIGS. 5, 6, and 8.

The embodiments above provide several temperature sensing and controlling mechanisms suitable for the resistive random access memory. The mechanisms may be adopted to solve the data write errors and data retention errors under high temperature, thereby lowering a defective rate and reducing device errors in the manufacturing process of resistive memory and thus increasing the reliability of a resistive memory system and lowering the bit error rate.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method for controlling a resistive random access memory, comprising:

when a data is to be written to the resistive random access memory, calculating a number of a bit value of the data;

if the number of the bit value is greater than a half of a length of the data, flipping each bit of the data and writing the data to the resistive random access memory; and if the number of the bit value is less than a half of the length of the data, writing the data as it original is to the resistive random access memory, wherein when a temperature of the resistive random access memory is greater than a switching temperature, the bit value is equal to 0, and when the temperature of the resistive random access memory is lower than the switching temperature, the bit value is equal to 1.

2. The method for controlling the resistive random access memory as claimed in claim 1, further comprising:

detecting a temperature of the resistive random access memory; and setting a reference resistance of a sense amplifier of the resistive random access memory according to the temperature.

3. The method for controlling the resistive random access memory as claimed in claim 2, further comprising:

when the temperature of the resistive random access memory is lower than a switching temperature, switching to a normal mode, and setting the reference resistance at a first resistance corresponding to the normal mode; and when the temperature of the resistive random access memory is higher than the switching temperature, switching to a high temperature mode, and setting the reference resistance at a second resistance corresponding to the high temperature mode, wherein the first resistance is greater than the second resistance.

4. The method for controlling the resistive random access memory as claimed in claim 3, further comprising:

when a time duration that the temperature of the resistive random access memory is lower than the switching temperature reaches a preset length of time, switching to the normal mode and setting the reference resistance at the first resistance; and when a time duration that the temperature of the resistive random access memory is higher than the switching temperature reaches the preset length of time, switching to the high temperature mode and setting the reference resistance at the second resistance.

5. The method for controlling the resistive random access memory as claimed in claim 3, wherein if resistance drifting occurs in one of resistive memory devices that has a resistance greater than the second resistance in the resistive random access memory, the resistance of the resistive memory device is still greater than the second resistance after resistance drifting.

6. The method for controlling the resistive random access memory as claimed in claim 3, wherein the bit value is equal to 1 in the normal mode and equal to 0 in the high temperature mode.

7. The method for controlling the resistive random access memory as claimed in claim 6, further comprising:

when switching from a first mode to a second mode, reading all the data of the resistive random access memory by continuing using the reference resistance of the first mode, writing all the data back to the resistive random access memory according to the second mode, and then setting the reference resistance at a reference resistance corresponding to the second mode, wherein the first mode is one of the normal mode and the high temperature mode, and the second mode is the other of the normal mode and the high temperature mode.

8. The method for controlling the resistive random access memory as claimed in claim 1, further comprising:
- if the number of the bit value is greater than a half of the length of the data, setting a flag bit; and
- when the data is read from the resistive random access memory, if the flag bit is already set, flipping each bit of the data to restore the data.

9. The method for controlling the resistive random access memory as claimed in claim 1, further comprising:
- writing a data to the resistive random access memory by using a write voltage;
- detecting a number of errors when the data is written; and
- if the number of errors exceeds a threshold, increasing the write voltage and repeating the writing step and the detecting step.

10. The method for controlling the resistive random access memory as claimed in claim 9, wherein the data is coded with an error correcting code before being written to the resistive random access memory, and the threshold is equal to the number of errors that the error correcting code is able to correct.

11. The method for controlling the resistive random access memory as claimed in claim 1, further comprising:
- coding a data with a first error correcting code, and writing the data to the resistive random access memory;
- detecting a number of errors when the data is written; and
- if the number of error exceeds a threshold corresponding to the first error correcting code, replacing the first error correcting code with a second error correcting code and repeating the coding step and the detecting step, wherein a number of errors that the second error correcting code is able to correct is greater than the number of errors that the first error correcting code is able to correct.

12. The method for controlling the resistive random access memory as claimed in claim 11, wherein the threshold is a decreasing function of a number of a bit value of the data, and an upper limit of the threshold is the number of errors that the first error correcting code or the second error correcting code is able to correct.

13. The method for controlling the resistive random access memory as claimed in claim 12, wherein the bit value is 0.

14. The method for controlling the resistive random access memory as claimed in claim 1, further comprising:
- writing a data to the resistive random access memory by using a first write voltage set;
- detecting a number of errors when the data is written;
- if the number of errors is greater than a threshold, storing the data in a waiting register; and
- if the waiting register is already full of data, writing all the data stored in the waiting register to the resistive random access memory by using a second write voltage set, wherein the second write voltage set is higher than the first write voltage set.

15. The method for controlling the resistive random access memory as claimed in claim 1, further comprising:
- distinguishing a resistance states of a resistive memory device of the resistive random access memory according to a reference resistance in reading operation as to read the data stored in the resistive memory device;
- detecting a temperature of the resistive random access memory; and
- setting the reference resistance of a sense amplifier of the resistive random access memory according to the temperature.

\* \* \* \* \*